(12) United States Patent
Sato et al.

(10) Patent No.: US 12,431,853 B2
(45) Date of Patent: Sep. 30, 2025

(54) NOISE FILTER

(71) Applicant: TOKIN Corporation, Shiroishi (JP)

(72) Inventors: Shu Sato, Sendai (JP); Yuta Nakano, Sendai (JP); Koichi Kondo, Sendai (JP); Koki Harada, Sendai (JP)

(73) Assignee: TOKIN CORPORATION, Shiroishi (JP)

( * ) Notice: Subject to any disclaimer, the term of this patent is extended or adjusted under 35 U.S.C. 154(b) by 392 days.

(21) Appl. No.: 18/146,898

(22) Filed: Dec. 27, 2022

(65) Prior Publication Data

US 2023/0216465 A1 Jul. 6, 2023

(30) Foreign Application Priority Data

Dec. 28, 2021 (JP) .................. 2021-213812

(51) Int. Cl.
*H03H 7/06* (2006.01)
*H03H 1/00* (2006.01)
*H05K 1/18* (2006.01)

(52) U.S. Cl.
CPC .............. *H03H 7/06* (2013.01); *H05K 1/181* (2013.01); *H03H 1/0007* (2013.01); *H05K 2201/1003* (2013.01); *H05K 2201/1006* (2013.01)

(58) Field of Classification Search
CPC ...... H03H 1/0007; H03H 7/0115; H03H 7/06; H01F 27/29
USPC .......................................... 333/175, 181, 185
See application file for complete search history.

(56) References Cited

U.S. PATENT DOCUMENTS

| 4,832,620 A | 5/1989 | Yamamoto |
| 2009/0278650 A1* | 11/2009 | Shieh .................... H01F 27/027 336/200 |
| 2009/0280688 A1 | 11/2009 | Kawada et al. |
| 2011/0036624 A1 | 2/2011 | Kagimura et al. |

FOREIGN PATENT DOCUMENTS

| EP | 2437312 B1 | 5/2019 |
| JP | H08124754 A | 5/1996 |
| JP | 2551775 Y2 | 10/1997 |
| JP | 2000114905 A | 4/2000 |
| JP | 2001167948 A | 6/2001 |
| JP | 3956144 B2 | 8/2007 |
| JP | 2019186891 A | 10/2019 |

OTHER PUBLICATIONS

European Patent Office, Office Action Issued in Application No. 22216875.9, Sep. 4, 2024, Germany, 5 pages.
(Continued)

*Primary Examiner* — Rakesh B Patel
(74) *Attorney, Agent, or Firm* — McCoy Russell LLP

(57) ABSTRACT

A noise filter that can be miniaturized is provided. A noise filter includes a terminal fitting, a board, a coil mounted on the board, and an electronic component mounted on the board. The terminal fitting includes a terminal body electrically connected to an external device, a coil connection part electrically connected to the coil through a lead wire, and a board connection part electrically connected to the board. The coil connection part caulks the lead wire.

10 Claims, 14 Drawing Sheets

(56) References Cited

OTHER PUBLICATIONS

European Patent Office, Summons to Attend Oral Proceedings Pursuant to Rule 115(1) EPC Issued in Application No. 22216875.9, Feb. 28, 2025, Germany, 8 pages.
European Patent Office, Partial European Search Report Issued in Application No. 22216875.9, May 22, 2023, Germany, 10 pages.
European Patent Office, Result of Consultation Issued in Application No. 22216875.9, Feb. 7, 2025, Germany, 3 pages.
Japan Patent Office, Office Action Issued in Application No. 2021-213812, Jul. 29, 2025, 6 pages. (Submitted with Machine Translation).

* cited by examiner

NOISE FILTER

CROSS-REFERENCE TO RELATED APPLICATION

This application is based upon and claims the benefit of priority from Japanese patent application No. 2021-213812, filed on Dec. 28, 2021, the disclosure of which is incorporated herein in its entirety by reference.

BACKGROUND

The present disclosure relates to a noise filter, and more particularly to a noise filter in which a coil is mounted on a board.

The noise filter disclosed in Japanese Unexamined Patent Application Publication No. 2000-114905 includes a terminal block, a coil, a printed circuit board, and a case. The printed circuit board is housed in the case facing the coil in a vertical direction, close to outer sides of the coil. Various electronic components such as a capacitor and a resistor are mounted on the printed circuit board. The terminal block is provided close to an upper outside of the printed circuit board, and is inserted through inside and outside of an upper part of the side of the case.

SUMMARY

The inventors have discovered the following problem.

Since the printed circuit board is provided between the terminal block and the coil, there is a limitation in miniaturization of the noise filter by reducing a width between the terminal block and the coil. Therefore, there is a room to consider miniaturization of such a noise filter.

In view of the above problem, it is an object of the present disclosure to provide a noise filter that can be miniaturized.

In an example aspect of the present disclosure, a noise filter
- a terminal fitting;
- a board;
- a coil mounted on the board; and
- an electronic component mounted on the board,
- the terminal fitting includes a terminal body electrically connected to an external device, a coil connection part electrically connected to the coil through a lead wire, and a board connection part electrically connected to the board, and
- the coil connection part caulks the lead wire.

With such a configuration, a large current and a signal current can be separated from each other, so that the large current is made to flow to an upper part and the signal current is made to flow to a lower part. In this manner, the design of the board can be made compact, thereby miniaturizing the noise filter.

The noise filter may be characterized in that the board connection part supports the coil connection part. The noise filter may be characterized in that a length from the terminal body to the coil connection part is shorter than a length from the terminal body to the board connection part.

With such a configuration, it is possible to stabilize separation of flows between a large current and a signal current.

The noise filter may be characterized in that the board connection part is positioned below the coil connection part.

Such configuration has the effect of preventing the terminal fitting from being deformed during caulking by the coil connection part. In addition, since it is not necessary to support the coil connection part from below by using a tool or the like during the caulking, the coil connection part and the coil can be brought close to each other to ensure assemblability while achieving miniaturization.

The noise filter may be characterized in that the board connection part is soldered to the board.

With such a configuration, the board connection part becomes conductive to the board, and a current can be supplied to the electronic component through the board.

The noise filter may be characterized in that the board connection part includes a plurality of wall parts rising from the board, and
the plurality of wall parts support the coil connection part.

With such a configuration, the position of the coil connection part is stabilized even if the coil connection part is bent downward to caulk the lead wire, because the plurality of wall parts support the coil connection part. Therefore, assemblability of the noise filter can be ensured.

The noise filter may be characterized in that a current flowing through the coil connection part is 30 to 60 A, and
a current flowing through the board connection part is 1 to 10 mA.

With such a configuration, the ranges of currents flowing through the coil connection part and the board connection part respectively are defined. This allows satisfactory separation between large and signal currents.

The noise filter may be characterized in that a DC resistance from the terminal body to the coil connection part in the terminal fitting is 0.15 to 0.25 m$\Omega$, and
a DC resistance from the coil connection part to the board connection part in the terminal fitting is 0.3 to 0.5 m$\Omega$.

With such a configuration, the range of the DC resistance in the terminal fitting from the terminal body to the coil connection part and the range of the DC resistance from the coil connection part to the board connection part are defined. This allows satisfactory separation between large and signal currents.

The noise filter may be characterized in that it further
a terminal block,
the terminal block supports the terminal body,
the terminal fitting further comprises a tongue piece extending from the terminal body to a sidewall face of the terminal block,
the tongue piece includes a fitting hole, and
the fitting hole is fitted to a fitting claw provided on a side surface of the terminal block.

With such a configuration, since the fitting hole is fitted to the fitting claw, the position of the terminal fitting with respect to the terminal block is stabilized. The noise filter can be easily assembled with satisfactory accuracy.

The noise filter may be characterized in that it further includes:
a metal lid and an insulating plate.
The metal lid covers the coil connection part, and
the insulating plate is disposed between the coil connection part and the metal lid.

With such a configuration, an insulation distance between the metal lid and the coil connection part can be ensured. It is possible to increase the current or miniaturize the noise filter while reducing the conduction between the metal lid and the coil connection part.

The noise filter may be characterized in that the insulating plate extends from the terminal block supporting the terminal body to between the coil connection part and the metal lid.

With such a configuration, the insulating plate extends from the terminal block to between the coil connection part and the metal lid to block the coil connection part from the metal lid. Thus, the insulation distance between the metal lid and the coil connection part can be more reliably ensured.

In another example aspect of the present disclosure, a noise filter includes:
 a terminal fitting;
 a board;
 a coil mounted on the board; and
 an electronic component mounted on the board,
  the terminal fitting includes a coil connection part electrically connected to the coil through a lead wire, and a board connection part electrically connected to the board,
  the coil connection part caulks the lead wire, and
  the board connection part supports the coil connection part.

With such a configuration, a large current and a signal current can be separated from each other, so that the large current is made to flow to an upper part and the signal current is made to flow to a lower part. In this manner, the design of the board can be made compact, thereby miniaturizing the noise filter.

The present disclosure can provide a noise filter that can be miniaturized.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS (Related Technique)

Prior to the description of embodiments, the technique related to the embodiments will be described with reference to FIG. 14.

Figure 14:
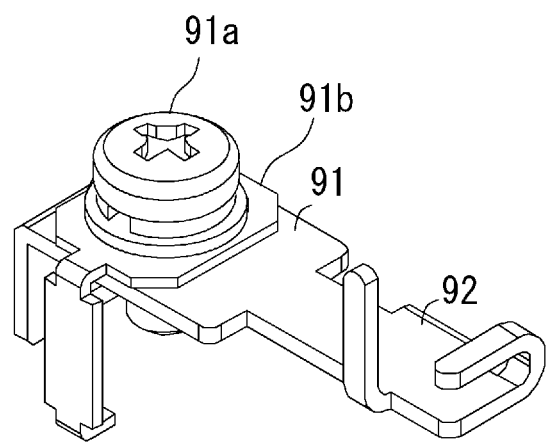
FIG. 14 is a perspective view showing a terminal fitting according to a related technique.
Figure 14:
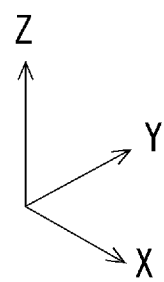

A terminal fitting 901 shown in FIG. 14 includes a terminal body 91, a coil connection part 92, a male screw 91a, and a washer 91b. The male screw 91a is fastened to the terminal body 91 to sandwich a connection wire of an external device (not shown) between the washer 91b and the terminal body 91. The terminal body 91 is electrically connected to the external device through the connection wire (not shown). The coil connection part 92 caulks a lead wire (not shown) of a coil (not shown) and is electrically connected to the coil through the lead wire. The terminal body 91 and the coil connection part 92 are positioned at approximately the same height. The terminal body 91 and the coil connection part 92 are integrally formed by forming and processing a single plate-like body.

With the configuration of the terminal fitting 901, the terminal fitting 901 can be electrically connected to the external device and the coil. However, other configurations are required to electrically connect the terminal fitting to a board. If the coil connection part 92 caulks the lead wire of the coil (not shown), there is a risk that the coil connection part 92 may receive an external force downward, the terminal fitting 901 may bend, and the coil connection part 92 may move lower than the terminal body 91. Also, the terminal fitting 901 and the board (not shown) are not electrically connected to each other.

Hereinafter, specific embodiments to which the present disclosure is applied will be described in detail with reference to the drawings. However, the present disclosure is not limited to the following embodiments. In addition, the following descriptions and drawings have been simplified, as appropriate, for clarity of the descriptions.

First Embodiment

A configuration of a noise filter according to a first embodiment will be described with reference to FIGS. 1 to 8.

Figure 1:
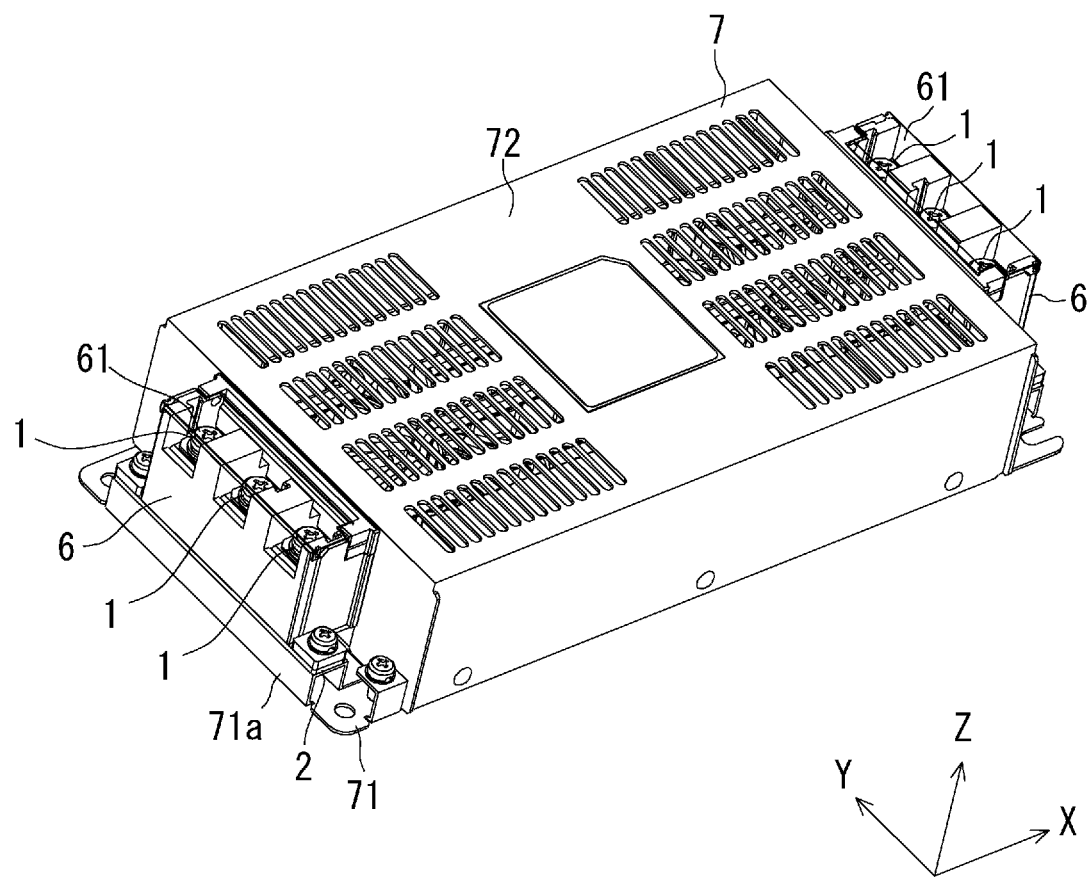
FIG. 1 is a perspective view showing a noise filter according to a first embodiment.
Figure 2:
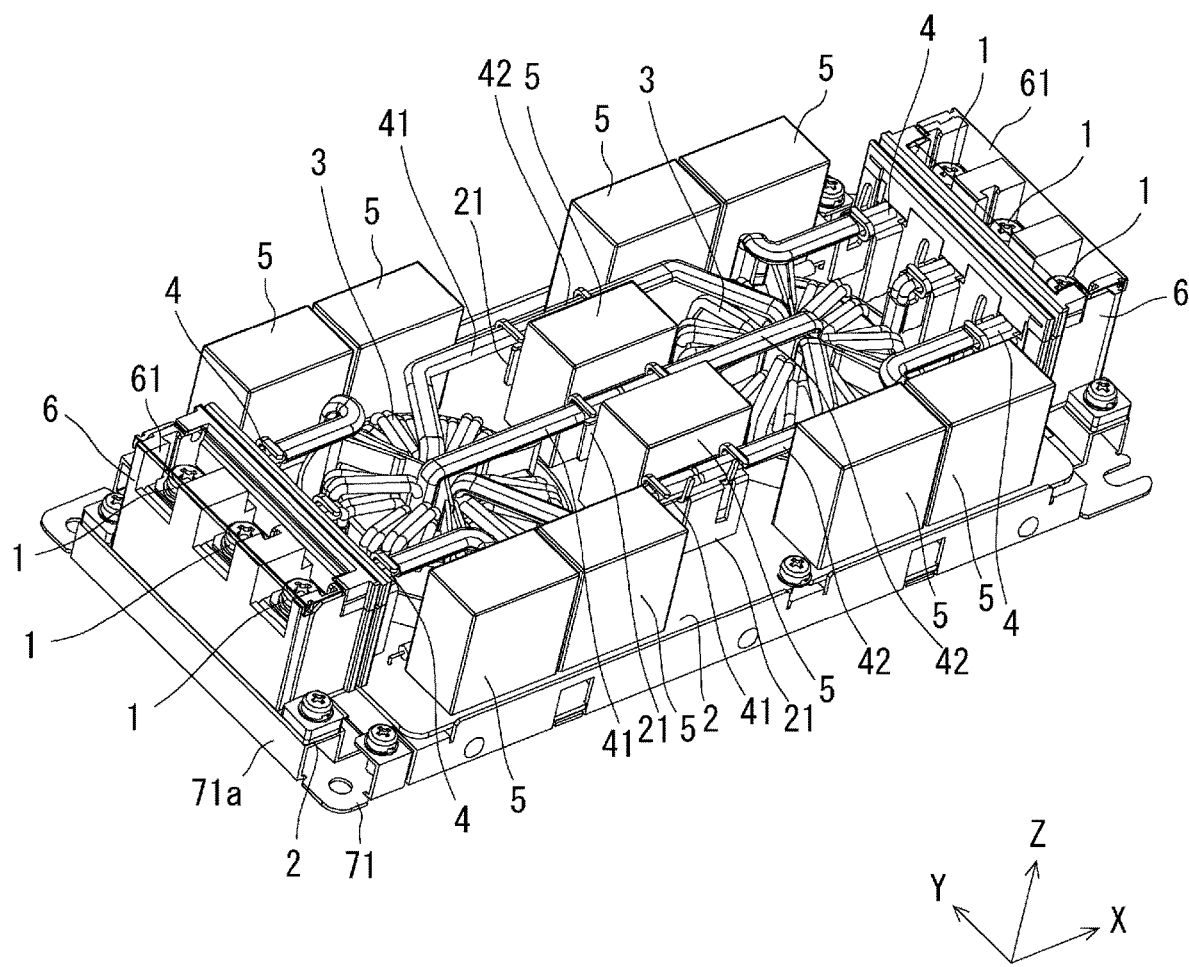
FIG. 2 is a perspective view of the noise filter with a lid removed according to the first embodiment.

FIG. 1 is a perspective view showing the noise filter according to the first embodiment. FIG. 2 is a perspective view showing the noise filter shown in FIG. 1 with a lid removed.

It is obvious that the right-handed XYZ coordinates shown in FIG. 1 and other drawings are for convenience in describing the positional relationships of the components. Usually, a positive direction of a Z-axis is vertically upward and an XY plane is a horizontal plane, which are used commonly among the drawings.

As shown in FIGS. 1 and 2, a noise filter 100 includes terminal fittings 1, a board 2, coils 3, and electronic components 5. The noise filter 100 according to this embodiment further includes terminal blocks 6 and a metal case 7.

The metal case 7 houses at least some of the coils 3 and the electronic components 5. The metal case 7 covers at least some of the terminal fittings 1, the board 2, and the terminal blocks 6. The metal case 7 may have an opening. At least some of the terminal fittings 1 and terminal blocks 6 may be exposed from the opening. One example of the metal case 7 shown in FIG. 1 is a substantially rectangular solid.

The metal case 7 includes a bottom plate 71 and a lid 72. The bottom plate 71 supports the board 2. The lid 72 is detachably provided on the bottom plate 71.

The board 2 has a predetermined printed wiring pattern. A resistor may be mounted on the board 2 as appropriate. At least one each of the coil 3 and electronic component 5 are mounted on the board 2. The coil 3 is electrically connected to the terminal fitting 1 through a lead wire 4. The lead wire 4 may be an end of the coil 3 or another member connected to the end of the coil 3. The terminal fittings 1, the coils 3, and the electronic components 5 are electrically connected to each other through the printed wiring pattern of the board 2. The lead wires 4 can be wired while avoiding contact interference with other members at lower parts of the coils 3 by being pulled out toward upper parts of the coils 3 (toward the positive direction of the Z-axis).

A plurality of the coils 3 and electronic parts 5 are mounted on the one example of the board 2 shown in FIG. 2. The one example of the board 2 shown in FIG. 2 is a substantially rectangular plate. The two coils 3 are arranged with a predetermined space therebetween in a longitudinal direction (an X-axis direction in this case) of the one example of the board 2 shown in FIG. 2. The two coils 3 are electrically connected to each other through the lead wires 41 and 42. The lead wires 41 and 42 may be ends of the coils 3 or other members connected to the ends of the coils 3. The lead wires 41 and 42 are electrically connected to each other by relay terminals 21. The plurality of electronic components 5 are disposed between and around the two coils 3. Each of the electronic components 5 is, for example, a capacitor. The lead wires 41 and 42 can be wired while avoiding contact interference with other members at lower parts of the coils 3 by being pulled out toward upper parts of the coils 3 (toward the positive direction of the Z-axis).

Figure 3:
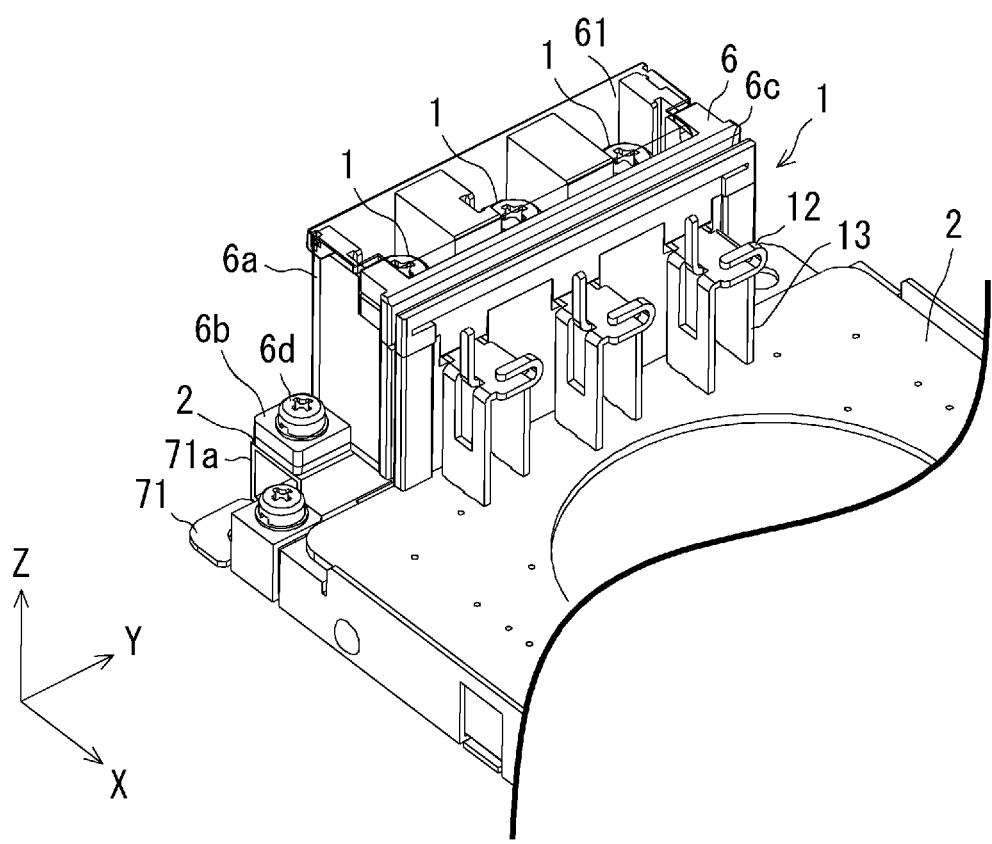
FIG. 3 is a perspective view showing a terminal block and its surroundings of the noise filter according to the first embodiment.
Figure 4:
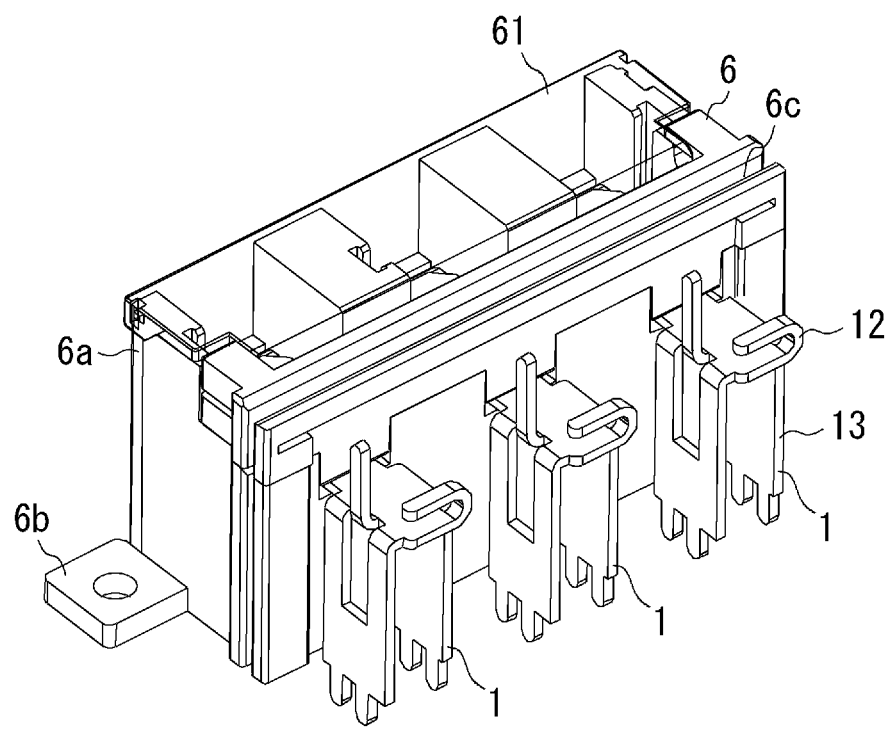
FIG. 4 is a perspective view showing the terminal block of the noise filter and terminal fittings attached to it according to the first embodiment.
Figure 4:
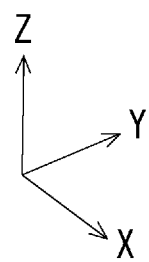

FIG. 3 is a perspective view showing the terminal block and its surroundings of the noise filter shown in FIG. 1. FIG. 4 is a perspective view showing the terminal block shown in FIG. 3 and the terminal fittings attached to the terminal block. In FIG. 3, the coils 3, lead wires 4, electronic components 5, and lid 72 are not shown.

As shown in FIGS. 3 and 4, the terminal block 6 and the board 2 are stacked on an end 71a of the bottom plate 71. The terminal block 6 includes a terminal holding part 6a, a flange 6b, and a groove 6c. The terminal block 6 includes at least one terminal holding part 6a. The terminal holding part 6a holds the terminal fittings 1. As described later, a large current flows through the coils 3 and the lead wires 4. Therefore, the coils 3 and the lead wires 4 are thick and hard to be deformed. For this reason, if the height of the terminal holding part 6a is adjusted to positions of coil connection parts 12 and the lead wires 4, the coil connection parts 12, the lead wires 4, and the coils 3 can be easily electrically connected, which is preferable. The flange 6b extends from the bottom of the terminal block 6. The flange 6b of the terminal block 6, the board 2, and the end 71a of the bottom plate 71 are fastened by a bolt 6d. The bottom plate 71, the board 2, and the terminal block 6 are stacked in this order. The groove 6c may have a shape that can be fitted to the opening of the lid 72 of the metal case 7. A transparent cover 61 is provided above the terminal holding part 6a of the terminal block 6. By fitting the groove 6c to the opening of the lid 72 of the metal case 7, the terminal block 6 is fixed not only by fastening the flange 6b, the board 2 and the end 71a of the bottom plate 71 with the bolt 6d, but also by the metal case 7. Therefore, the stress applied by the terminal block 6 is distributed and transmitted to the metal case 7, the board 2, the bottom plate 71, and a board connection part 13.

It is thus possible to reduce the stress applied to soldered parts of the board connection part 13.

Figure 5:
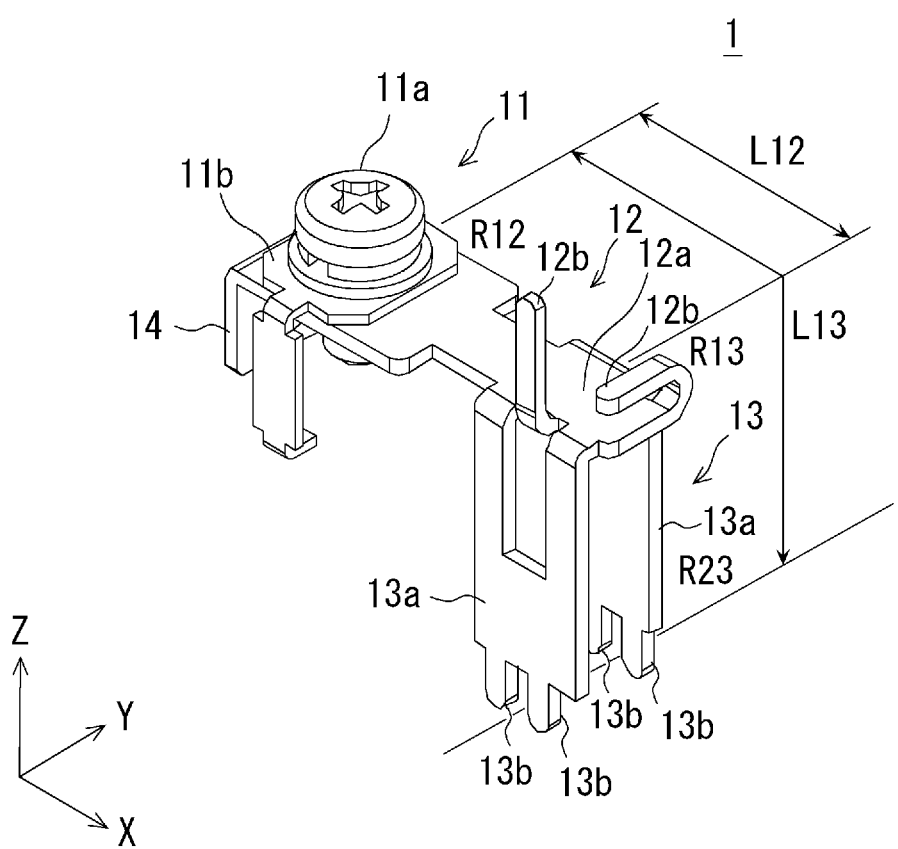
FIG. 5 is a perspective view showing the terminal fitting of the noise filter according to the first embodiment.
Figure 6:
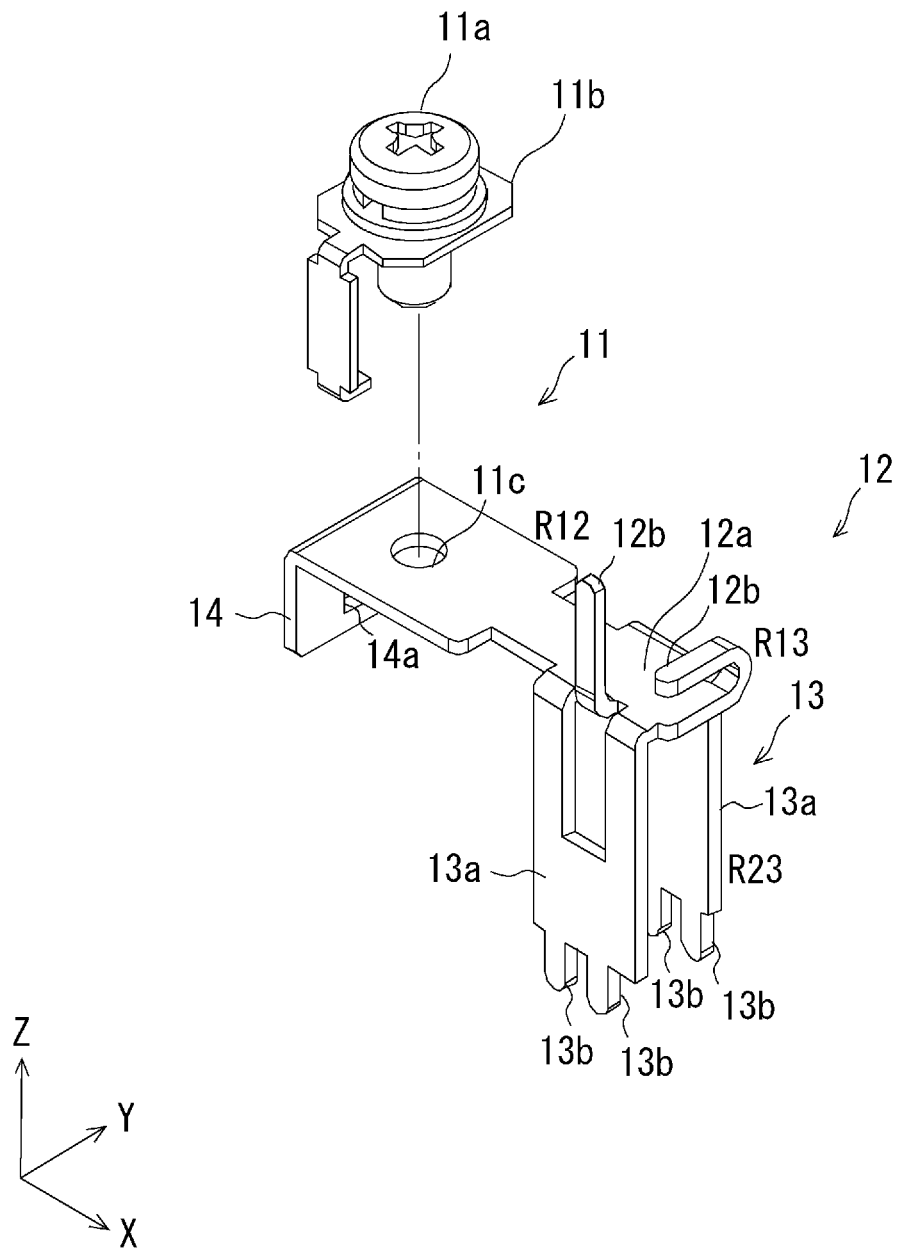
FIG. 6 is an exploded perspective view of the terminal fitting of the noise filter according to the first embodiment.

FIG. 5 is a perspective view showing the terminal fitting shown in FIG. 4. FIG. 6 is an exploded perspective view of the terminal fitting shown in FIG. 5. As shown in FIGS. 5 and 6, the terminal fitting 1 includes a terminal body 11, the coil connection part 12, and the board connection part 13. One example of a part of the terminal body 11, the coil connection part 12, and the board connection part 13 shown in FIGS. 5 and 6 are integrally formed by forming and processing a single plate-like body.

The one example of the terminal fitting 1 shown in FIGS. 5 and 6 extends in an approximately L-shape inverted vertically and horizontally on the front (a ZX plane in this case) of the noise filter 100. The terminal body 11 is positioned in the terminal holding part 6a of the terminal block 6. The coil connection part 12 is positioned on the coil 3 side of the terminal block 6. The coil connection part 12 extends from the terminal body 11 to the coil 3 side of the terminal block 6. The coil connection part 12 is positioned at approximately the same height as that of the terminal body 11. The board connection part 13 is positioned below the coil connection part 12. The board connection part 13 may support the coil connection part 12.

The terminal body 11 has a hole 11c. The hole 11c has a female threaded part. A male screw 11a and a washer 11b are provided for the terminal body 11. The male screw 11a is inserted through the washer 11b and fastened to the female screw part of the hole 11c. The washer 11b is supported by a spring (not shown). When the male screw 11a is loosened, the washer 11b is pushed upward by the spring (not shown) and the male screw 11a moves upward by the pressure of the washer 11b. A washer such as a spring washer or a flat washer may be provided between the male screw 11a and the washer 11b. A connection wire (not shown) is sandwiched between the washer 11b and the terminal body 11, and the male screw 11a is fastened to the washer 11b. Then, the terminal body 11 can be electrically connected to an external device (not shown) through the connection wire. The external device is, for example, a power supply. The terminal body 11 further includes a tongue piece 14. The tongue piece 14 has a fitting hole 14a. The terminal body 11 and the washer 11b may be fixed to the terminal block 6 by fitting a fitting claw (not shown) extending from the terminal block 6 to the fitting hole 14a. A second embodiment described later shows a specific example of a method of fixing the male screw 11a and the washer 11b to the terminal block 6 by a snap-fit by using the fitting hole 14a.

The coil connection part 12 caulks the lead wire 4. FIGS. 3 to 6 show an example of the coil connection part 12 before the lead wire 4 is caulked. One example of the coil connection part 12 shown in FIGS. 5 and 6 includes a lead wire holding part 12a and a claw 12b. The claw 12b is bent toward the lead wire holding part 12a side while the lead wire 4 is held by the lead wire holding part 12a. The lead wire holding part 12a and the claw 12b tighten the lead wire 4 to fix it. In this way, the one example of the coil connection part 12 caulks the lead wire 4. After the one example of the coil connection part 12 caulks the lead wire 4, the one example of the coil connection part 12 may be soldered to the lead wire 4. Such soldering ensures that the one example of the coil connection part 12 is reliably electrically connected to the lead wire 4. In addition, the lead wire 4 can be firmly fixed to the one example of the coil connection part 12.

The board connection part 13 includes a plurality of wall parts 13a and a plurality of soldered parts 13b. The plurality of wall parts 13a rise from the board 2 and support the coil connection part 12. The board connection parts 13 are soldered to the board 2. Specifically, each of the plurality of soldered parts 13b projects downward (a negative direction of the Z-axis in this case) from the plurality of wall parts 13a. The plurality of soldered parts 13b penetrate a plurality of holes of the board 2, respectively, and are soldered to the board 2 on a lower surface of the board 2.

A length L13 from the terminal body 11 to the board connection part 13 of the terminal fitting 1 is specifically a length from the terminal body 11 to the soldered part 13b. The length L13 may be longer than a length L12 from the terminal body 11 to the coil connection part 12 of the terminal fitting 1.

When the length L13 is longer than the length L12, a DC resistance R13 from the terminal body 11 to the board connection part 13 in the terminal fitting 1 is higher than a DC resistance R12 from the terminal body 11 to the coil connection part 12 in the terminal fitting 1. Specifically, the range of the DC resistance R12 is, for example, 0.15 to 0.25 mΩ. The range of a DC resistance R23 from the coil connection part 12 to the board connection part 13 in the terminal fitting 1 is, for example, 0.3 to 0.5 mΩ. The range of the DC resistance R13 (=R12+R23) from the terminal body 11 to the board connection part 13 in the terminal fitting 1 is, for example, 0.45 to 0.75 mΩ. The DC resistance R13 is higher than the DC resistance R12. A ratio of the DC resistance R13 to the DC resistance R12 is, for example, 1.8 to 5. When the DC resistances R12, R13, and R23 are set within the above range, the current flowing through the coils 3 becomes a large current. That is, the amount of the current flowing through the coils 3 becomes the same as the amount of the current flowing through a power line. Further, the current flowing through the electronic components 5 becomes a signal current. That is, the amount of the current flowing through the electronic components 5 becomes the same as the amount of the current flowing through a signal line. The signal currents are weak and small compared to the large current. The current flowing through the coil connection part 12 may be, for example, 30 to 60 A. The current flowing through the board connection part 13 may be, for example, 1 to 10 mA. That is, the power supply, which is the external device electrically connected to the terminal body 11 of one terminal fitting 1, applies a voltage to an electric circuit including the terminal body 11 of one of the two terminal bodies 11. A large current due to this voltage flows to one of the two coils 3 through the terminal body 11 and the coil connection part 12, and then to the other coil 3 through the relay terminal 21.

The large current then flows to another external device (not shown) through the coil connection part 12 and the terminal body 11 of the other terminal fitting 1. The other external device (not shown) is a load. On the other hand, the signal current flowing through the electronic component 5 on the board 2 flows to the board through the terminal body 11, the coil connection part 12, and the board connection part 13. The signal current then flows to another external device (not shown) through the board connection part and the coil connection part 12 and the terminal body 11 of the other terminal fitting 1.

Figure 7:
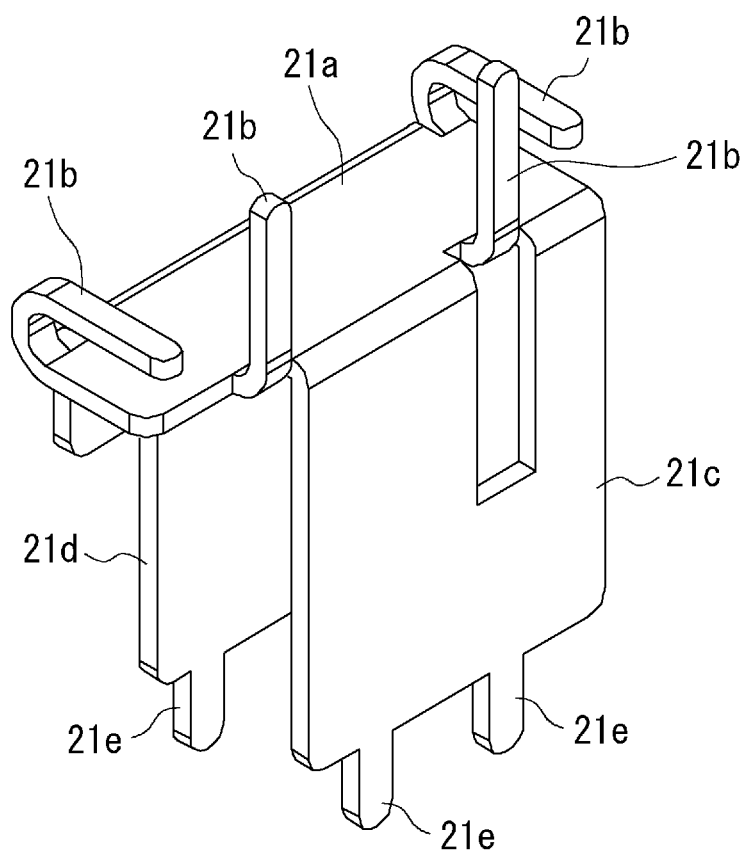
FIG. 7 is a perspective view showing a relay terminal of the noise filter according to the first embodiment.

FIG. 7 is a perspective view showing the relay terminal of the noise filter shown in FIG. 1. As shown in FIG. 7, the relay terminal 21 includes a lead wire holding part 21a, claws 21b, wall parts 21c and 21d, and a plurality of soldered parts 21e. One example of the lead wire holding part 21a, the claw 21b, the wall parts 21c and 21d, and the soldered parts 21e shown in FIG. 7 are integrally formed by forming and processing a single plate-like body.

The relay terminals 21 and 21 caulk the lead wires 41 and 42 shown in FIG. 2, respectively. Note that FIG. 7 shows an example of the relay terminal 21 before the lead wires 41 and 42 are caulked. Specifically, the claws 21b are bent toward the lead wire holding parts 21a side while the lead wires 41 and 42 are held by the lead wire holding parts 21a. The lead wire holding parts 21a and the claws 21b tighten and fix the lead wires 41 and 42. In this way, the relay terminals 21 caulk the lead wires 41 and 42, respectively. The relay terminals 21 electrically connect the lead wire 41 and the lead wire 42 to each other to relay the lead wire 41 and the lead wire 42. After the relay terminals 21 caulk the lead wires 41 and 42, the relay terminal 21 may be soldered to the lead wires 41 and 42, respectively. Such soldering ensures that the relay terminal 21 and the lead wires 41 and 42 are electrically connected. In addition, the lead wires 41 and 42 can be firmly fixed to the relay terminals 21, respectively.

The wall parts 21c and 21d extend from the lead wire holding part 21a toward the board 2 side. In other words, the wall parts 21c and 21d rise from the board 2 and support the lead wire holding part 21a.

The plurality of soldered parts 21e are soldered to the board 2. Specifically, each of the plurality of soldered parts 21e projects downward (the negative direction of the Z-axis in this case) from the wall parts 21c and 21d. The plurality of soldered parts 21e penetrate the plurality of holes of the board 2, respectively, and are soldered to the board 2 on a lower surface of the board 2.

Figure 8:
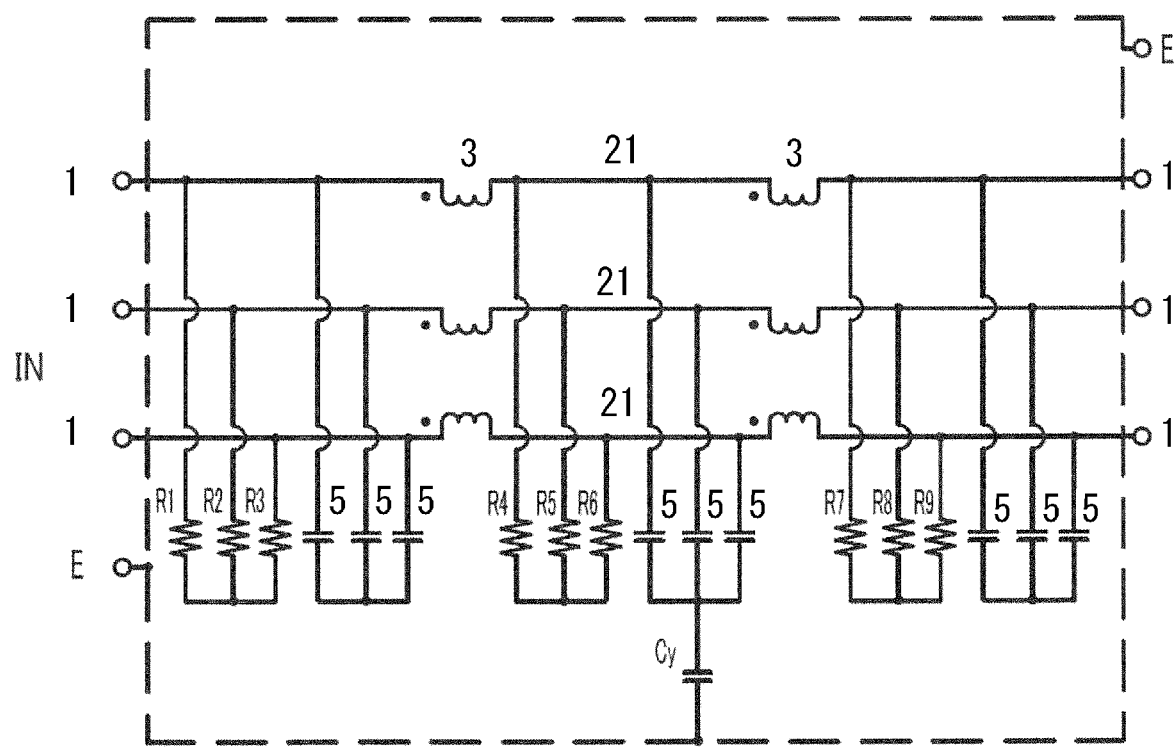
FIG. 8 is a circuit diagram of the noise filter according to the first embodiment.

As described above, the coils 3 and the electronic components 5 form an electric circuit, because they are electrically connected to each other through the terminal fittings 1, the printed wiring pattern of the board 2, and the relay terminals 21. One example of this formed electric circuit is shown in FIG. 8. FIG. 8 is a circuit diagram of the noise filter shown in FIG. 1. In the one example of the electronic circuit shown in FIG. 8, each of the electronic component 5 is a capacitor. In the one example of the electronic circuit shown in FIG. 8, resistors R1, R2, R3, R4, R5, R6, R7, R8, and R9 aresistors mounted on the board 2. The current flowing through the coils 3 is large compared to the current flowing through the capacitors (the electronic components 5) and the current flowing through the resistors R1 to R9. The current flowing through the coils 3 is a large current, about the same amount as that of the current flowing through the power line, for example, 30 to 60 A. The current flowing through the capacitors (the electronic components 5) and the current flowing through the resistors R1 to R9 are weak and amount thereof are about the same amount as that of the current flowing through the signal line, for example, 1 to 10 mA.

As described above, according to the configuration of the noise filter 100, power or signals can be supplied from the external device (not shown) to the coil 3 and the electronic component 5 through the terminal fittings 1. More specifically, a large current generated by a voltage from the power supply (not shown), which is the external device, can be supplied to the load (not shown), which is the external device, after common mode noise is removed through the coils 3. In addition, common mode noise and normal mode noise components on this line can be reduced by making them pass through the electronic components 5 on the board 2 through the board connection parts 13. In addition, since the board connection parts 13 of the terminal fittings 1 are positioned below the coil connection parts 12, the coil connection parts 12 and the coils 3 can be made close to each other. This enables miniaturization. In addition, the board connection parts 13 of the terminal fittings 1 are positioned below the coil connection parts 12, and the coil connection parts 12 caulk the lead wires 4. Thus, after the terminal fittings 1 are moved downward to install them on the board 2, the coil connection parts 12 can be bent downward to caulk the lead wires 4. That is, the terminal fittings 1 and the coils 3 are easily electrically connected through the lead wires 4. Therefore, assemblability can be ensured. That is, the structure of the noise filter 100 enables miniaturization while ensuring assemblability.

In addition, according to the configuration of the noise filter 100 of this embodiment, the board connection parts 13 are positioned below the coil connection parts 12 to support the coil connection parts 12. This has the effect of preventing the terminal fittings 1 from being deformed during caulking by the coil connection part 12. In addition, since it is not necessary to support the coil connection parts 12 from below by using a tool or the like during the caulking, the coil connection parts 12 and the coils 3 can be brought close to each other to ensure assemblability while achieving miniaturization.

In addition, according to the configuration of the noise filter 100 of this embodiment, the board connection parts 13 are soldered to the board 2. Therefore, the board connection parts 13 and the board 2 are stably electrically connected to each other. Therefore, noise components from external devices and power supplies can be reliably removed, and a current can be stably supplied to the electronic components 5 through the terminal fittings 1 and the board 2.

In addition, according to the configuration of the noise filter 100 of this embodiment, each of the board connection parts 13 includes the plurality of wall parts 13*a*, and the plurality of wall parts 13*a* support the coil connection part 12. Therefore, when the claws 12*b* of the coil connection parts 12 are bent downward to caulk the lead wires 4, the positions of the coil connection parts 12 in a height direction of the coil connection parts 12 are stabilized by a reaction force by the support of the plurality of wall parts 13*a*. Therefore, the lead wires 4 can be easily caulked.

In addition, according to the configuration of the noise filter 100 of this embodiment, the opening of the lid 72 is fitted to the groove 6*c* of the terminal block 6. Further, the flanges 6*b* of the terminal blocks 6, the board 2, and the ends 71*a* of the bottom plates 71 are fastened to each other by the bolts 6*d*. The terminal fittings 1 are held by the terminal holding parts 6*a* of the terminal blocks 6. In this way, the relative positions of the terminal fittings 1 and the board 2 are stabilized, so that the bonding between the soldered parts 13*b* of the board connection parts 13 and the board 2 can be maintained by soldering.

Second Embodiment

Figure 9:
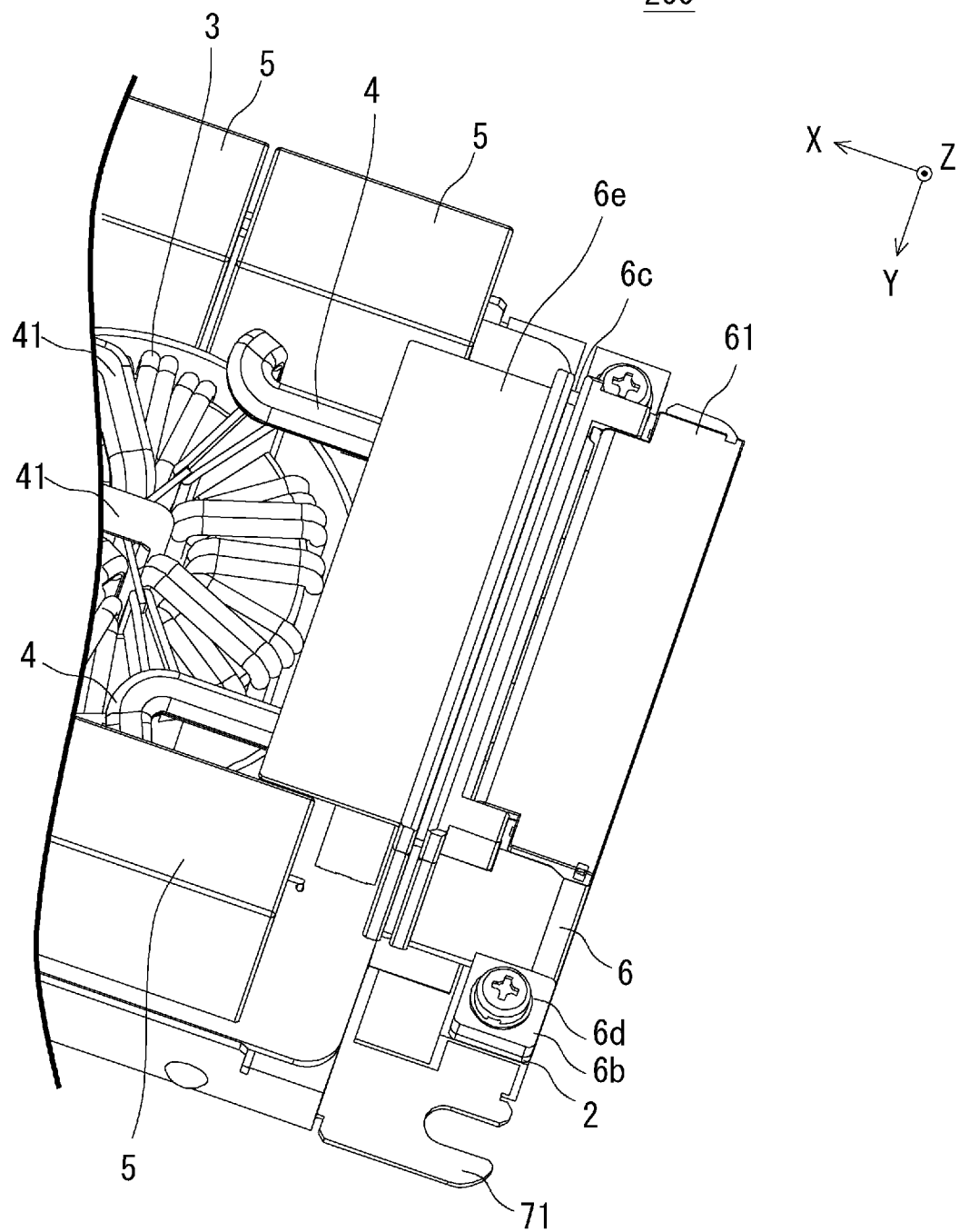
FIG. 9 is a top view showing a terminal block and its surroundings of a noise filter according to a second embodiment.

Next, a configuration of a noise filter according to a second embodiment is described with reference to FIGS. 9 to 13. FIG. 9 is a top view showing a terminal block and its surroundings of the noise filter according to the second embodiment.

Figure 10:
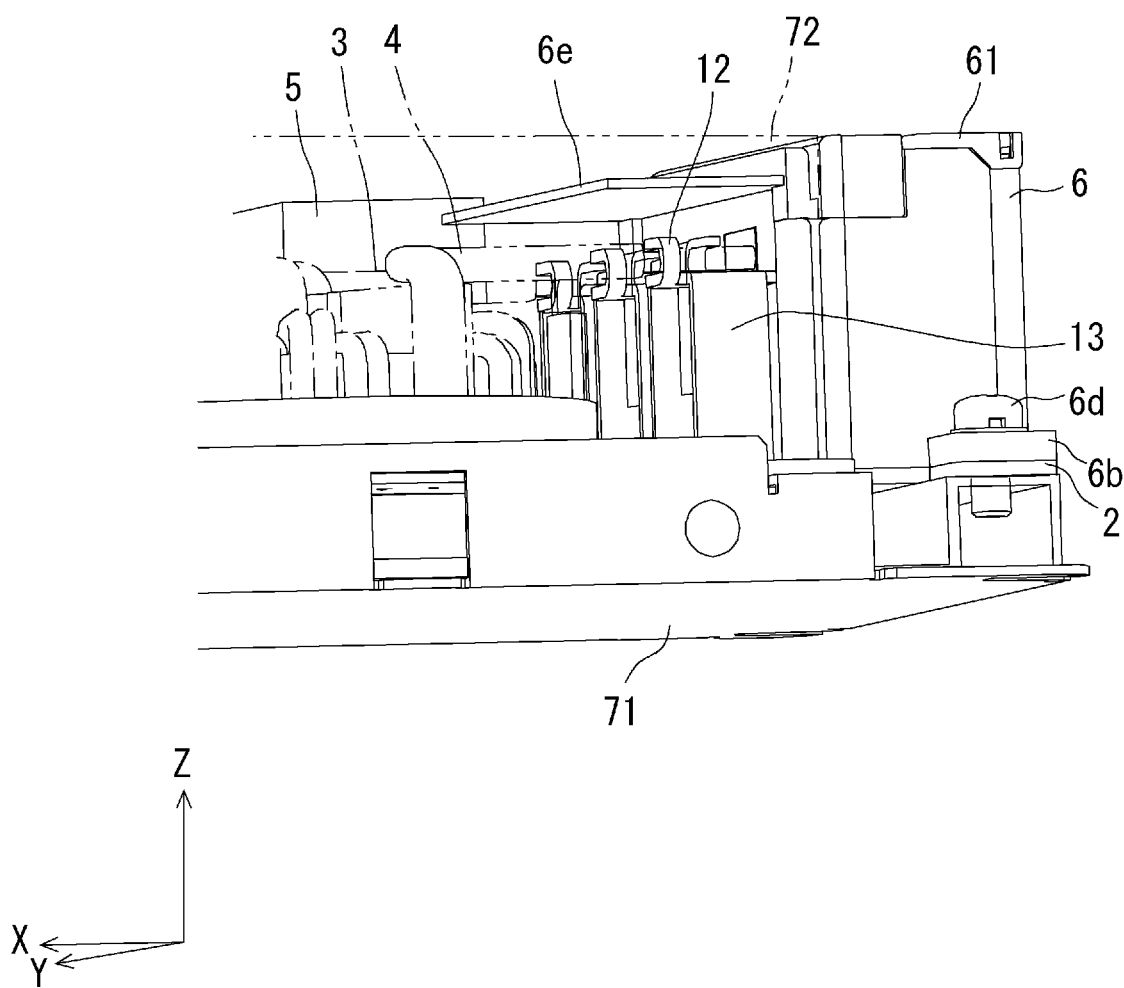
FIG. 10 is a perspective view showing a terminal block and its surroundings of the noise filter according to the second embodiment.
Figure 11:
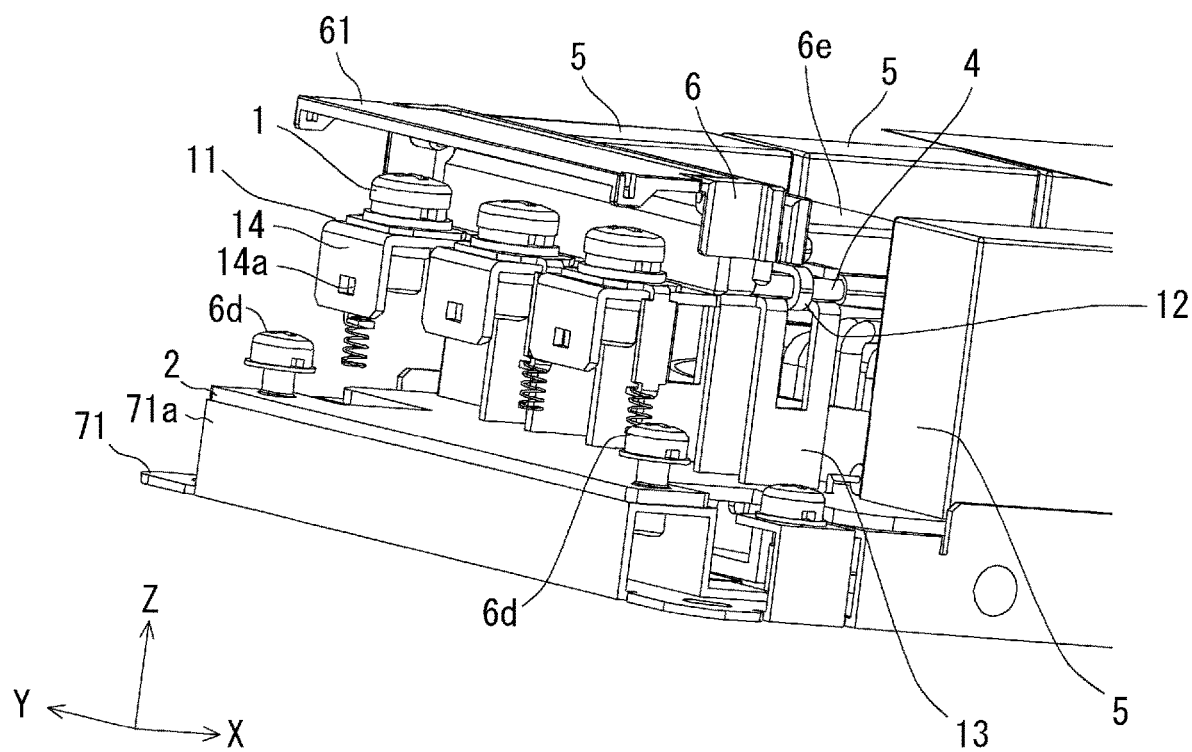
FIG. 11 is a perspective view showing the terminal fittings and their surroundings of the noise filter according to the second embodiment.
Figure 12:
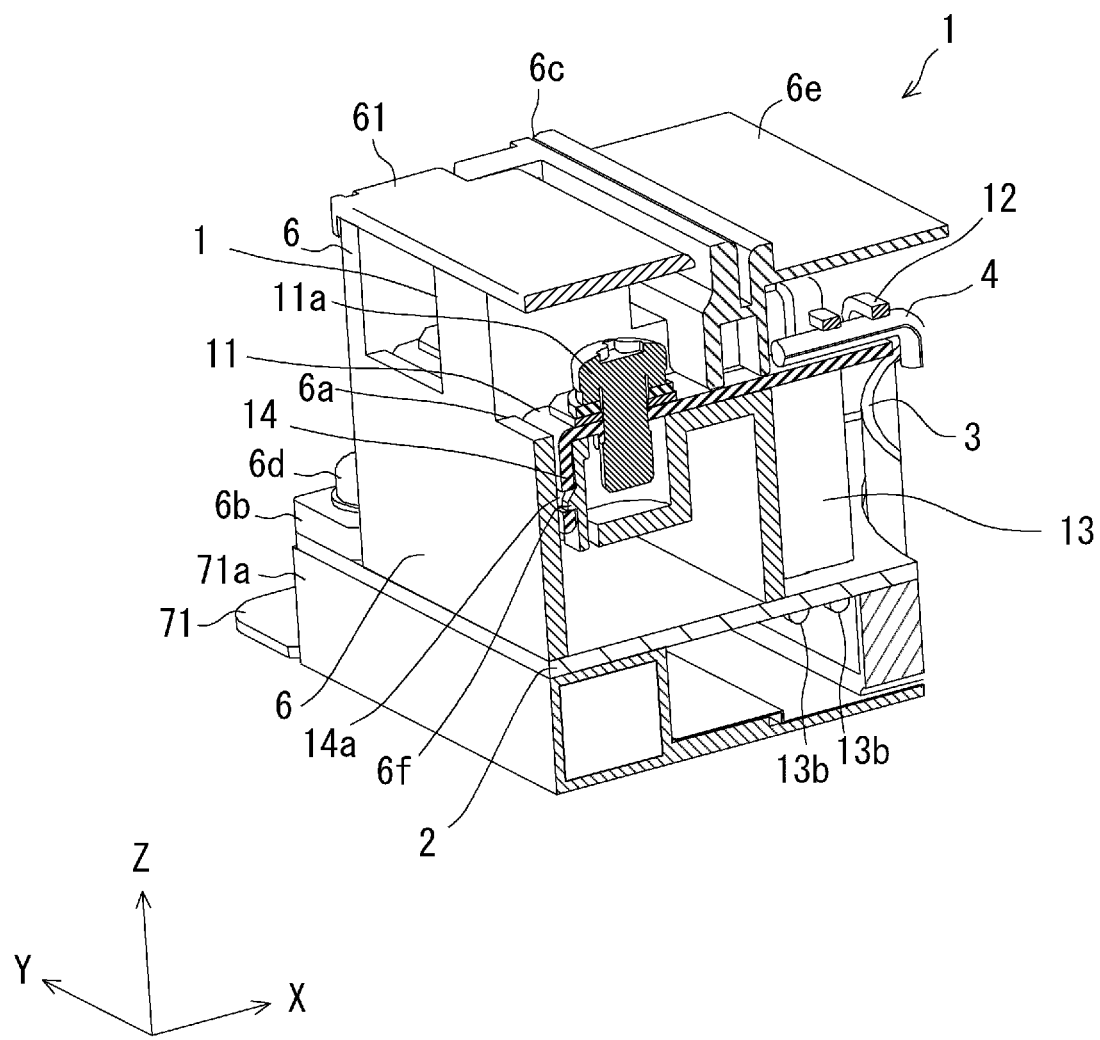
FIG. 12 is a perspective cross-sectional view showing the terminal block and its surroundings of the noise filter according to the second embodiment.
Figure 13:
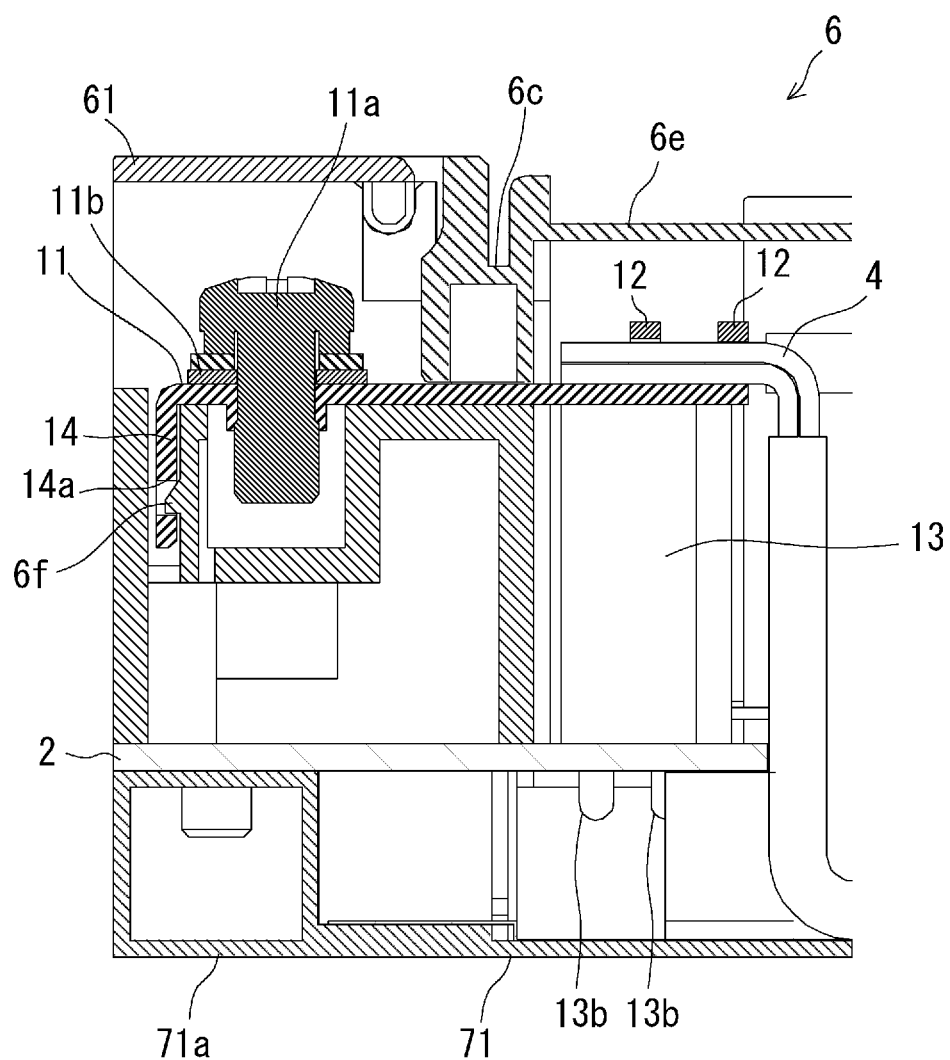
FIG. 13 is a cross-sectional view of the terminal block and its surroundings of the noise filter according to the second embodiment.

FIG. 10 is a perspective view of the terminal block and its surroundings shown in FIG. 9. FIG. 11 is a perspective view showing the terminal fittings and their surroundings of the noise filter shown in FIG. 9. FIG. 12 is a perspective cross-sectional view showing the terminal block and its surroundings of the noise filter shown in FIG. 9. FIG. 13 is a cross-sectional view of the terminal block and its surroundings shown in FIG. 12. The lid 72 is not shown in FIGS. 9 and 11 to 13. Furthermore, the terminal holding part 6*a* and the like are not shown in FIG. 11.

A noise filter 200 shown in FIG. 9 has the same configuration as that of the noise filter 100 shown in FIG. 1 except a part where the terminal block 6 includes an insulating plate 6*e* and a fitting claw 6*f*.

As shown in FIGS. 9 and 10, the terminal block 6 of the noise filter 200 includes the insulating plate 6*e*. The insulating plate 6*e* is provided on the coil 3 side of the terminal block 6. More specifically, the insulating plate 6*e* extends from the top of the terminal block 6 to between the lid 72 of the metal case 7 and the coil connection part 12.

The insulating plate 6*e* has an insulation property. The insulating plate 6*e* may be made of a material having an insulating property. Materials having this insulating property are, for example, rubber and plastic. The shape and size of the insulating plate 6*e* may be set so that an insulation distance between the terminal fittings 1 and the lid 72 of the metal case 7 is ensured. For example, when the noise filter 200 is viewed from above, a range in which the insulating plate 6*e* covers may include the coil connection parts 12.

As shown in FIGS. 12 and 13, the terminal block 6 of the noise filter 200 includes the fitting claw 6*f*. The fitting claw 6*f* is provided in the terminal holding part 6*a*. The fitting claw 6*f* has a shape that can be fitted to the fitting hole 14*a*. The fitting claw 6*f* is elastically deformable. The terminal fitting 1 is disposed on the terminal holding part 6*a*. Next, the tongue piece 14 is positioned in the terminal holding part 6*a* and hits the fitting claw 6*f*. Then, the fitting claw 6*f* is elastically deformed, so that the fitting claw 6*f* is fitted to the fitting hole 14*a*.

As described above, according to the configuration of the noise filter 200, the insulating plate 6*e* extends between the lid 72 of the metal case 7 and the coil connection part 12. Thus, the insulation distance between the terminal fittings 1 and the lid 72 of the metal case 7 can be ensured. Therefore, the electrical connection between the terminal fittings 1 and the lid 72 of the metal case 7 can be reduced. Such a configuration is particularly preferable when a large voltage is applied to the terminal fittings 1 or when the terminal fittings 1 and the metal case 7 are brought close to each other in order to miniaturize the noise filter 200.

In addition, according to the configuration of the noise filter 200, by disposing the terminal fittings 1 in the terminal holding part 6*a* of the terminal blocks 6, the fitting claws 6*f* is fitted to the fitting holes 14*a*, so that the positions and orientations of the terminal fittings 1 with respect to the terminal blocks 6 are stabilized. The assemblability of the noise filter 200 can thus be improved.

According to the configuration of the noise filter 200, the opening of the lid 72 is fitted to the groove 6*c* of the terminal block 6. The terminal fittings 1 are held by the terminal holding parts 6*a* of the terminal blocks 6. In this manner, the relative positions of the terminal fittings 1 and the lid 72 are stabilized, so that the insulation distance between the terminal fittings 1 and the lid 72 can be ensured.

Note that the present disclosure is not limited to the above embodiments and can be modified as appropriate without departing from the scope thereof. In addition, the present disclosure may be carried out by combining the above embodiments or examples thereof as appropriate. For example, the terminal block 6 of the noise filter 100 shown in FIG. 1 may have the fitting claw 6*f* in a manner similar to the terminal block 6 of the noise filter 200 shown in FIG. 11. Unlike the noise filter 100, the noise filter 200 need not have the electronic components 5. Also, unlike the noise filter 100, the noise filter 200 may have terminal fittings different from the terminal fittings 1. The terminal fitting may include the terminal body 11 and the coil connection part 12.

The first and second embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

The invention claimed is:

1. A noise filter comprising:
   a terminal fitting;
   a board;
   a coil mounted on the board; and
   an electronic component mounted on the board, wherein
   the terminal fitting includes a terminal body electrically connected to an external device, a coil connection part electrically connected to the coil through a lead wire, and a board connection part electrically connected to the board,
   the coil connection part includes a lead wire holding part and a claw, the claw is bent toward a lead wire holding part side while the lead wire is held by the lead wire holding part, the lead wire holding part and the claw tighten the lead wire to fix the lead wire, the coil connection part caulks the lead wire,
   the board connection part supports the coil connection part, and
   a length from the terminal body to the coil connection part is shorter than a length from the terminal body to the board connection part.

2. The noise filter according to claim 1, further comprising:
   a metal lid and an insulating plate, wherein
   the metal lid covers the coil connection part, and
   the insulating plate is disposed between the coil connection part and the metal lid.

3. The noise filter according to claim 2, wherein
   the insulating plate extends from the terminal block supporting the terminal body to between the coil connection part and the metal lid.

4. The noise filter according to claim 1, wherein
   the board connection part is positioned below the coil connection part.

5. The noise filter according to claim 1, wherein
   the board connection part is soldered to the board.

6. The noise filter according to claim 1, wherein
   the board connection part includes a plurality of wall parts rising from the board, and
   the plurality of wall parts support the coil connection part.

7. The noise filter according to claim 1, further comprising:
   a terminal block, wherein
   the terminal block supports the terminal body,
   the terminal fitting further comprises a tongue piece extending from the terminal body to a sidewall face of the terminal block,
   the tongue piece includes a fitting hole, and
   the fitting hole is fitted to a fitting claw provided on a side surface of the terminal block.

8. The noise filter according to claim 1, wherein
   a DC resistance from the terminal body to the coil connection part in the terminal fitting is 0.15 to 0.25 mΩ, and
   a DC resistance from the coil connection part to the board connection part in the terminal fitting is 0.3 to 0.5 mΩ.

9. A noise filter comprising:
   a terminal fitting;
   a board;
   a coil mounted on the board; and
   an electronic component mounted on the board, wherein
   the terminal fitting includes a terminal body electrically connected to an external device, a coil connection part electrically connected to the coil through a lead wire, and a board connection part electrically connected to the board,
   the coil connection part includes a lead wire holding part and a claw, the claw is bent toward a lead wire holding part side while a lead wire is held by the lead wire holding part, a lead wire holding part and the claw tighten a lead wire to fix a lead wire, the coil connection part caulks a lead wire,
   a current flowing through the coil connection part is 30 to 60 A, and
   a current flowing through the board connection part is 1 to 10 mA.

10. A noise filter comprising:
    a terminal fitting;
    a board;
    a coil mounted on the board; and
    an electronic component mounted on the board, wherein
    the terminal fitting includes a coil connection part electrically connected to the coil through a lead wire, and a board connection part electrically connected to the board,
    the coil connection part includes a lead wire holding part and a claw, the claw is bent toward a lead wire holding part side while a lead wire is held by the lead wire holding part, a lead wire holding part and the claw tighten a lead wire to fix a lead wire, the coil connection part caulks a lead wire,
    the board connection part supports the coil connection part, and
    a length from the terminal body to the coil connection part is shorter than a length from the terminal body to the board connection part.

* * * * *